(12) United States Patent
Morishima et al.

(10) Patent No.: US 6,577,021 B2
(45) Date of Patent: Jun. 10, 2003

(54) STATIC-TYPE SEMICONDUCTOR MEMORY DEVICE

(75) Inventors: Chikayoshi Morishima, Hyogo (JP);
Yoshinori Okumura, Hyogo (JP);
Takashi Kuroi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/096,728

(22) Filed: Mar. 14, 2002

(65) Prior Publication Data

US 2002/0190398 A1 Dec. 19, 2002

(30) Foreign Application Priority Data

Jun. 13, 2001 (JP) ........................................ 2001-178304

(51) Int. Cl.[7] .............................................. H01L 27/11
(52) U.S. Cl. ........................ 257/903; 257/904; 365/51; 365/154
(58) Field of Search ................................ 257/903, 904; 365/51, 154

(56) References Cited

U.S. PATENT DOCUMENTS

| | | | | |
|---|---|---|---|---|
| 5,072,286 A | * | 12/1991 | Minami et al. ............. | 257/903 |
| 5,105,385 A | * | 4/1992 | Ohtsuka et al. ............. | 365/185 |
| 5,654,572 A | * | 8/1997 | Kawase ....................... | 257/371 |
| 5,886,388 A | * | 3/1999 | Wada et al. ................. | 257/393 |
| 6,005,296 A | * | 12/1999 | Chan ........................... | 257/904 |
| 6,128,208 A | * | 10/2000 | Itoh et al. ...................... | 365/51 |
| 6,169,313 B1 | * | 1/2001 | Tsutsumi et al. ........... | 257/390 |
| 6,177,693 B1 | * | 1/2001 | Otsuki ......................... | 257/296 |
| 6,347,048 B2 | * | 2/2002 | Kumagai et al. ........... | 365/154 |
| 6,469,328 B2 | * | 10/2002 | Yanai et al. ................. | 257/207 |

FOREIGN PATENT DOCUMENTS

JP    10-178110    6/1998

* cited by examiner

*Primary Examiner*—David Nelms
*Assistant Examiner*—Andy Huynh
(74) *Attorney, Agent, or Firm*—McDermott, Will & Emery

(57) ABSTRACT

An SRAM of the present invention comprises a plurality of memory cells, which are formed over a plurality of wells, which store data and which do not have a well contact region for fixing the potential of the wells, and a plurality of well contact cells for fixing the potential of the wells that are formed over the plurality of wells so as to adjoin the memory cells, wherein the areas of the memory cells and the areas of the well contact cells are equal.

12 Claims, 16 Drawing Sheets

STATIC-TYPE SEMICONDUCTOR MEMORY DEVICE

BACKGROUND OF THE INVENTION

1. Field of the Invention

The present invention relates to a static-type semiconductor memory device (hereinafter referred to as SRAM (Static Random Access Memory)), in particular, to a memory cell structure of an SRAM.

2. Description of the Background Art

FIGS. 13 to 16 show a layout of memory cells of a conventional SRAM. In these figures two memory cells 1 and a well contact cell 2 are shown. In the case that a well contact region is formed in, respectively, all of the memory cells 1, the area of the memory cell 1 increases and, therefore, a well contact cell 2 is formed for a plurality of memory cells 1 so as to achieve the reduction of the area of the memory cell array.

As shown in FIG. 13, memory cells 1 are arranged, respectively, above and below well contact cell 2. Memory cells 1 and well contact cell 2 both have an n well in the middle and have p wells on both the right and left sides of this n well.

One memory cell 1 has six MOS Metal Oxide Semiconductor) transistors. In more detail, memory cell 1 has n type access MOS transistors Q1, Q2, n type driver MOS transistors Q3, Q4 as well as p type load MOS transistors Q5 and Q6.

In upper memory cell 1, access MOS transistor Q1 is formed at a part where a diffusion region 40$i$ and a polysilicon layer 3$b$ cross, access MOS transistor Q2 is formed at a part where a diffusion region 40$a$ and a polysilicon layer 3$c$ cross, driver MOS transistor Q3 is formed at a part where diffusion region 40$i$ and a polysilicon layer 3$d$ cross, driver MOS transistor Q4 is formed at a part where diffusion region 40$a$ and a polysilicon layer 3$a$ cross, load MOS transistor Q5 is formed at a part a diffusion region 40$d$ and polysilicon layer 3$a$ cross and load MOS transistor Q6 is formed at a part where a diffusion region 40$e$ and polysilicon layer 3$d$ cross.

In lower memory cell 1, access MOS transistor Q1 is formed at a part where a diffusion region 40$k$ and a polysilicon layer 3$j$ cross, access MOS transistor Q2 is formed at a part where a diffusion region 40$c$ and a polysilicon layer 3$k$ cross, driver MOS transistor Q3 is formed at a part where diffusion region 40$k$ and a polysilicon layer 3$l$ cross, driver MOS transistor Q4 is formed at a part where diffusion region 40$c$ and a polysilicon layer 3$i$ cross, load MOS transistor Q5 is formed at a part where a diffusion region 40$g$ and polysilicon layer 3$i$ cross and load MOS transistor Q6 is formed at a part where a diffusion region 40$h$ and polysilicon layer 3$l$ cross.

Well contact cell 2 has diffusion regions 40$b$, 40$f$, 40$j$ and polysilicon layers 3$e$, 3$f$, 3$g$ and 3$h$.

FIG. 14 shows a layout of contact parts 5, 5$e$ to 5$f$ and 5$i$. As shown in FIG. 14, predetermined regions in diffusion regions 40$a$ to 40$k$ are electrically connected to upper layer wires via contact part 5, 5$e$ to 5$f$ and 5$i$. In addition, a predetermined polysilicon layer from among polysilicon layers 3$a$ to 3$l$ is also electrically connected to an upper layer wire, or the like, via contact part 5.

P$^+$ diffusion regions 40$b$ and 40$j$ are fixed at the ground potential via contact parts 5$e$ and 5$f$ and, thereby, the p well is fixed at the ground potential. In addition, n$^+$ diffusion region 40$f$ is fixed at the power supply potential via contact part 5$i$ and, thereby, the n well is fixed at the power supply potential.

Polysilicon layers 3$e$ and 3$f$ are dummy layers for securing the periodicity of polysilicon layers of upper memory cell 1 in FIG. 13. In addition, polysilicon layers 3$g$ and 3$h$ are dummy layers for securing the periodicity of polysilicon layers of lower memory cell 1 in FIG. 13.

FIG. 15 shows first metal wire layers 7, with first via holes 6, formed in a layer above polysilicon layers 3$a$ to 3$l$.

As shown in FIG. 15, first metal wire layers 7 are formed so as to make connections between contact parts 5 or between contact parts 5 and contact parts 5$e$, 5$f$ and 5$i$ while first via holes 6 are created at predetermined positions in first metal wire layers 7.

FIG. 16 shows a layout of second metal wire layers 9 and third metal wire layers 10$a$ to 10$e$, with second via holes 8, formed in a layer above first metal wire layers 7.

As shown in FIG. 16, first metal wire layers 7 and second metal wire layers 9 are connected via first via holes 6 while second metal wire layers 9 and third metal wire layers 10$a$ to 10$e$ are connected via second via holes 8.

In the above conventional SRAM, as shown in FIG. 13, insulation regions are formed between diffusion regions 40$b$, 40$f$, 40$j$ within well contact cell 2 and diffusion regions 40$a$, 40$c$, 40$e$, 40$g$, 40$i$, 40$k$ within memory cell 1 so as to separate these regions. Therefore, the length L of well contact cell 2 in the upper and lower direction of FIG. 13 becomes larger than the length L1 of memory cell 1 so that the areas of memory cell 1 and well contact cell 2 become different.

In addition, by separating diffusion regions in well contact cell 2 as described above, the regularity of the pattern (in particular, diffusion region pattern or polysilicon layer pattern) which is repeated regularly among adjoining memory cells 1 is disturbed in well contact cell 2. That is to say, the existence of well contact cell 2 disturbs the periodicity of the pattern layout.

Diffusion regions 40$a$ to 40$k$ and polysilicon layers 3$a$ to 3$l$ are usually formed by using a photolithographic technology and in the case that the periodicity of the pattern layout is disturbed as described above, a dispersion of the size of the pattern is easily caused at the time of the formation of each pattern. Therefore, a problem arises that the dispersion of the transistor characteristics is easily caused.

Here, as shown in FIG. 13, by arranging polysilicon layers 3$e$, 3$f$, 3$g$ and 3$h$ as dummy layers, the fluctuation of the periodicity of the polysilicon layers in memory cells 1 can be restricted to a certain degree. However, this effect becomes smaller together with the miniaturization of memory cells 1 and the effect is not very apparent for the miniaturized memory cells 1.

In addition, as for a layout wherein the periodicity of the pattern of memory cells 1 is taken into consideration, the layout shown in U.S. Pat. No. 6,128,208 can be cited. According to the invention described in this reference, however, well contact cell 2 is not provided and the idea of the layout in the case that well contact cell 2 is provided is not disclosed in this reference.

SUMMARY OF THE INVENTION

The present invention is provided in order to solve the above problem. A purpose of the present invention is to prevent the periodicity of the pattern layout of diffusion regions, polysilicon layers, or the like, from being disturbed in an SRAM which has well contact cells and memory cells.

An SRAM (static-type semiconductor memory device) according to the present invention comprises a plurality of memory cells and well contact cells. The memory cells do not have a well contact region and provided over a plurality of wells for storing data. The well contact cells for fixing the potential of the wells are provided over a plurality of wells so as to adjoin memory cells. The area of a memory cell and the area of a well contact cell are equal.

By making the area of a memory cell and the area of a well contact cell equal, as described above, a pattern similar to that within a memory cell, such as for diffusion regions or for polysilicon layers (gates), can be formed in the same manner in a well contact cell. Thereby, the periodicity of the above pattern can be prevented from being disturbed in well contact cells.

A memory cell has a first diffusion region of a first conductive type while a well contact cell has a second diffusion region of a second conductive type for fixing the potential of the well. In this case, it is preferable to connect the first and second diffusion regions within the well contact cell via a third diffusion region.

By linking a diffusion region from within a memory cell to within a well contact cell in this manner, the diffusion region can be extended from the inside of a memory cell to the inside of a well contact cell in a contiguous manner. For example, the diffusion region can be formed so as to cross the well contact cell. As a result, it becomes unnecessary to separate a diffusion region inside of a well contact cell, as opposed to in a prior art, and the periodicity of the diffusion region pattern can be prevented from being disturbed in a well contact cell.

A well contact cell has a first conductive layer which extends above the third diffusion region and fixes the first conductive layer to the ground potential.

In this manner, by providing a first conductive layer within a well contact cell, for example, the periodicity of the pattern of the conductive layers which become the gates of MOS transistors within a memory cell can be secured. At this time, an element of a similar structure to that of a MOS transistor is formed of the first conductive layer and the above first to third diffusion regions within the well contact cell. Even though this element has a similar structure to a MOS transistor, this element does not operate in the same manner as a MOS transistor. In the present invention such an element is referred to as a pseudo transistor. Though this pseudo transistor is considered to not operate as a transistor under usual conditions, the pseudo transistor can be prevented without fail from mistakenly operating by fixing the first conductive layer that corresponds to the gate of the pseudo transistor at the ground potential as described above. Thereby, the pseudo transistor can be prevented from causing negative effects to the memory cell so that the normal operation of the memory cell can be secured.

The SRAM of the present invention is provided with bit lines. Then, the above first diffusion region is connected to a bit line. In such a case, by fixing the first conductive layer at the ground potential, as described above, the well contact cell and the bit line can be electrically isolated.

The above plurality of wells include a first well of the first conductive type (corresponding to an n well in the example of FIG. 1) and a second well of the second conductive type (corresponding to a p well in the example of FIG. 1). In this case, the first, second and third diffusion regions (corresponding to predetermined diffusion regions within diffusion region 4a in the example of FIG. 1) are positioned in the second well, the well contact cell is positioned in the first well and has a fourth diffusion region (comprising to an n type diffusion region within diffusion region 4d in the example of FIG. 1) of the first conductive type which is positioned in the first well and is for fixing the potential of the first well and the memory cell has a fifth diffusion region (corresponding to a p type diffusion region within diffusion region 4d in the example of FIG. 1) of a second conductive type which is located in the first well. Then, the fourth diffusion region and the fifth diffusion region are connected within the well contact cell via a sixth diffusion region (corresponding to an n type diffusion region within diffusion region 4d beneath polysilicon layer 3f in the example of FIG. 1), a second conductive layer (corresponding to polysilicon layer 3f in the example of FIG. 1) is formed above the sixth diffusion region and the fourth diffusion region, the fifth diffusion region and the second conductive layer are fixed at the power supply potential.

As described above, a pseudo transistor is formed on the first well of a different conductive type (polarity) from that of the second well and, in this case, the pseudo transistor can be prevented, without fail, from operating by fixing the fourth diffusion region, the fifth diffusion region and the second conductive layer at the power supply potential. Thereby, the normal operation of the memory cell can be secured.

The plurality of wells include the first well of the first conductive type and the second well of the second conductive type. A memory cell has a first diffusion region of the first conductive type and a third diffusion region of the second conductive type while a well contact cell has a second diffusion region of the second conductive type for fixing the potential of the well and a fourth diffusion region of the first conductive type. At this time the first and second diffusion regions are located in the second well while the third and fourth diffusion regions are positioned in the first well. Then, the first and second diffusion regions are isolated within the well contact cell while the third and fourth diffusion regions are connected within the well contact cell via a fifth diffusion region.

In this manner, parts of diffusion regions may be extended from the inside of a memory cell to the inside of a well contact cell while other parts of diffusion regions may be isolated within the well contact cell. In this case, though the periodicity of the diffusion region pattern may be some what disturbed in a part wherein diffusion regions are isolated, the periodicity of the diffusion region pattern can be secured in the parts where the diffusion region is formed to be contiguous from the inside of a memory cell to the inside of a well contact cell. Accordingly, the periodicity of the pattern can be secured in comparison with the prior art.

The first conductive layer is formed above the region between the above first and second diffusion regions and the second conductive layer is formed above the fifth diffusion region. In this case, it is preferable to fix the second conductive layer, the third diffusion region and the fourth diffusion region at the power supply potential.

Since the first and second diffusion regions are isolated from each other, as described above, a pseudo transistor is not formed of the first conductive layer and these diffusion regions. Accordingly, the first conductive layer need not be fixed at the ground potential. However, the second conductive layer, the third diffusion region, the fourth diffusion region and the fifth diffusion region form a pseudo transistor. Therefore, by fixing the second conductive layer, the third diffusion region and the fourth diffusion region at the power supply potential, the above pseudo transistor can be prevented, without fail, from operating.

The SRAM is provided with bit lines and the first diffusion region is connected to a bit line. In this case, by isolating the first and second diffusion regions from each other, as described above, the bit line and the well contact cell can be electrically isolated.

Memory cells may be arranged on both sides of the above well contact cell. In addition, a plurality of well contact cells may be arranged adjoining each other. In either case the periodicity of the pattern layout can be secured.

It is preferable that the above plurality of well contact cells include first and second well contact cells wherein the first well contact cell has a second diffusion region and a seventh diffusion region of the second conductive type which is connected to this second diffusion region while the second well contact cell has an eighth diffusion region of the second conductive type that is connected to the seventh diffusion region and extends within the first well contact cell.

In this manner, extending a diffusion region from the inside of the first well contact cell to the inside of the second well contact cell in a contiguous manner, the periodicity of the pattern layout can be secured from among the well contact cells.

It is preferable to arrange the memory cells and the well contact cells in the direction (direction of extension of each well) perpendicular to the direction along which a plurality of wells are arranged. In this case that, by extending diffusion regions in the direction of the extension of each well, a diffusion region can be formed in a contiguous manner from the inside of a memory cell to the inside of a well contact cell so that the periodicity of the diffusion region pattern can be secured. Accordingly, the present invention is useful for a memory cell array which has the cell arrangement as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention are described in reference to FIGS. 1 to 12.
First Embodiment FIGS. 1 to 4 are plan views of a memory cell array (memory cell region) of an SRAM (static semiconductor memory device) according to the present first embodiment. FIG. 5 is a diagram of an equivalent circuit of the SRAM according to the present embodiment. Here, FIGS. 1 to 4 show, respectively, layouts from the lower layer wires to the upper layer wires of the memory cell array.

Figure 1:
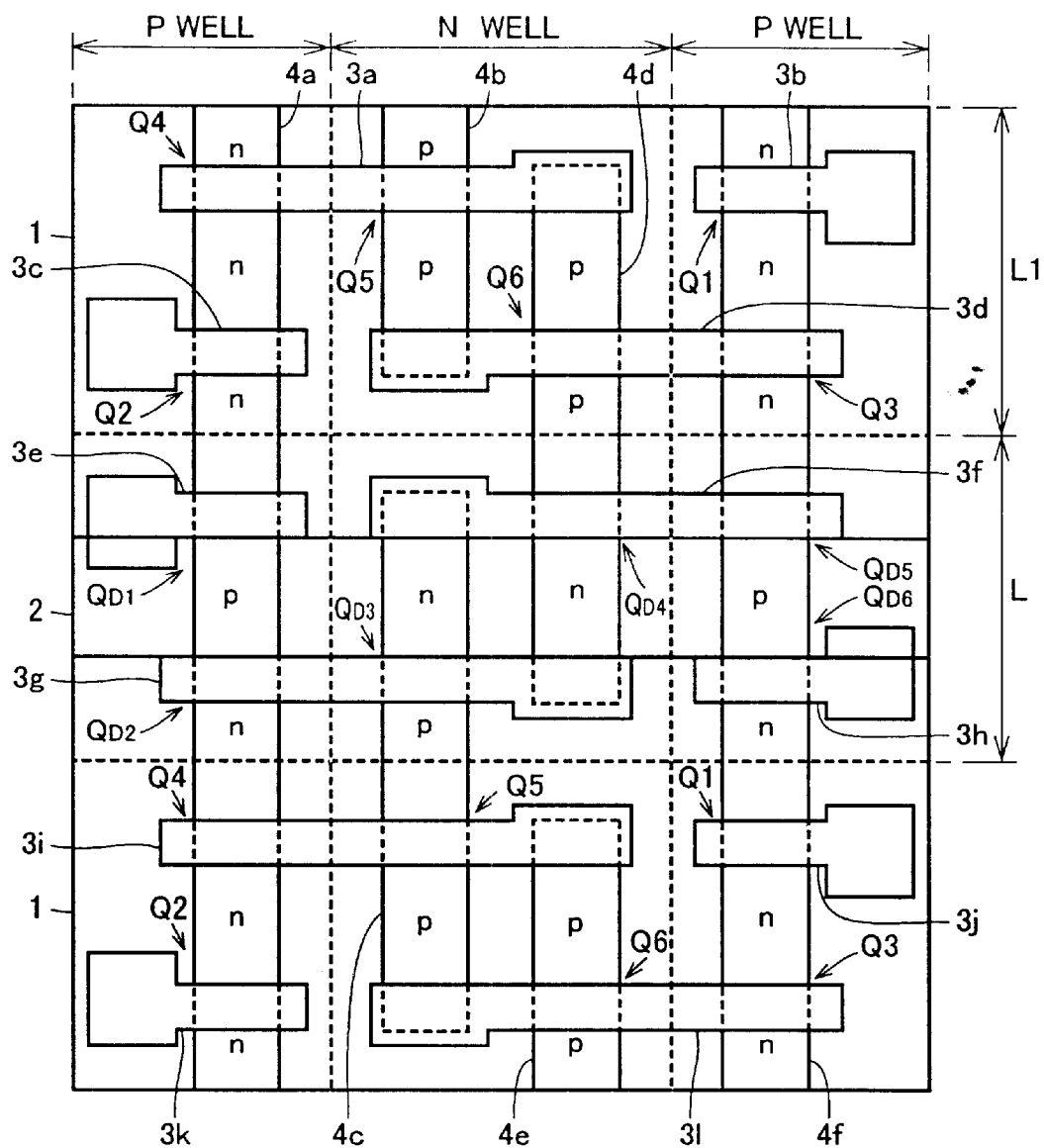
FIG. 1 is a plan view showing a layout of wells, polysilicon layers and diffusion regions in a memory cell array of an SRAM according to first embodiment of the present invention.

The SRAM is provided with the memory cell array which includes memory cells 1 and well contact cell 2 shown in FIG. 1 and a peripheral circuit region wherein a peripheral circuit for controlling the operations of memory cells 1 is formed.

As shown in FIG. 1, well contact cell 2 is arranged adjoining memory cells 1. This well contact cell 2 is provided for a plurality of memory cells 1. P wells and n wells are arranged in alternation within memory cells 1 and well contact cells 2. P wells are arranged on both sides of an n well and diffusion regions 4a to 4f are formed so as to extend in the direction (longitudinal direction in FIG. 1 and direction along which each well extends) perpendicular to the direction along which p wells and n wells are arranged (lateral direction in FIG. 1).

Diffusion regions 4a to 4f, which include a plurality of regions of the conductive type (polarity) shown in FIG. 1, are selectively formed within the p wells or n wells and polysilicon layers (gates or dummy gates) 3a to 3l, which extend in the lateral direction, are formed so as to lie on diffusion regions 4a to 4f.

Memory cells 1 store data and do not have a well contact region for fixing the potential of the well. In addition, a memory cell 1 has a full CMOS cell structure and has six MOS transistors. In particular, a memory cell 1 has n type access MOS transistors Q1, Q2, n type driver MOS transistors Q3, Q4 as well as p type load MOS transistors Q5 and Q6.

In upper side memory cell 1 access MOS transistor Q1 is formed at the part where diffusion region 4f and polysilicon layer 3b cross, access MOS transistor Q2 is formed at the part where diffusion region 4a and polysilicon layer 3c cross, driver MOS transistor Q3 is formed at the part where diffusion region 4f and polysilicon layer 3d cross, driver MOS transistor Q4 is formed at the part where diffusion region 4a and polysilicon layer 3a cross, load MOS transistor Q5 is formed at the part where diffusion region 4b and polysilicon layer 3a cross and load MOS transistor Q6 is formed at the part where diffusion region 4d and polysilicon layer 3d cross.

In lower side memory cell 1 access MOS transistor Q1 is formed at the part where diffusion region 4f and polysilicon layer 3j cross, access MOS transistor Q2 is formed at the part where diffusion region 4a and polysilicon layer 3k cross, driver MOS transistor Q3 is formed at the part where diffusion region 4f and polysilicon layer 3l cross, driver MOS transistor Q4 is formed at the part where diffusion region 4a and polysilicon layer 3i cross, load MOS transistor Q5 is formed at the part where diffusion region 4c and polysilicon layer 3i cross and load MOS transistor Q6 is formed at the part where diffusion region 4e and polysilicon layer 3l cross.

Figure 13:
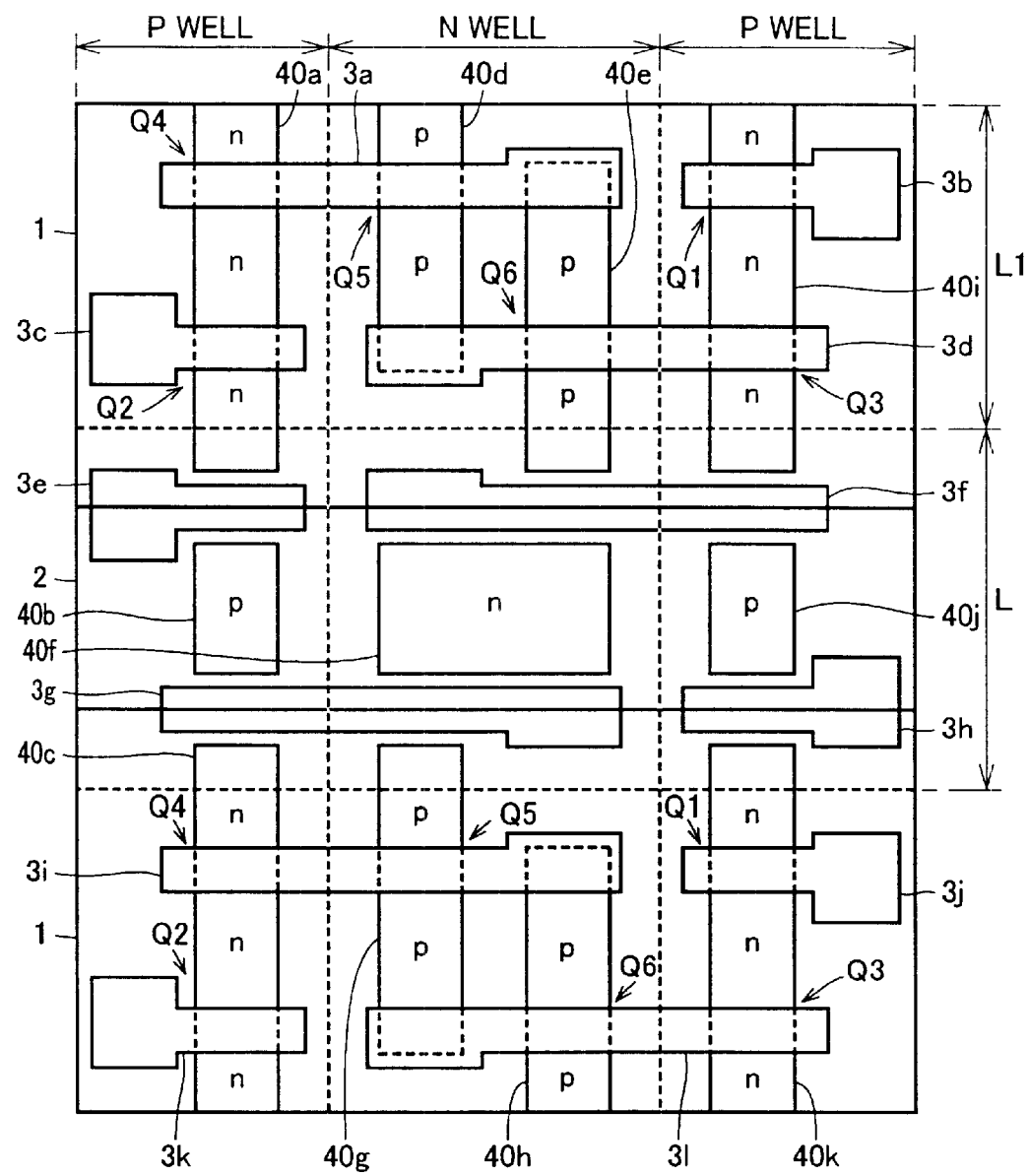
FIG. 13 is a plan view showing a layout of wells, polysilicon layers and diffusion regions in a memory cell array of an SRAM according to a prior art.
Figure 14:
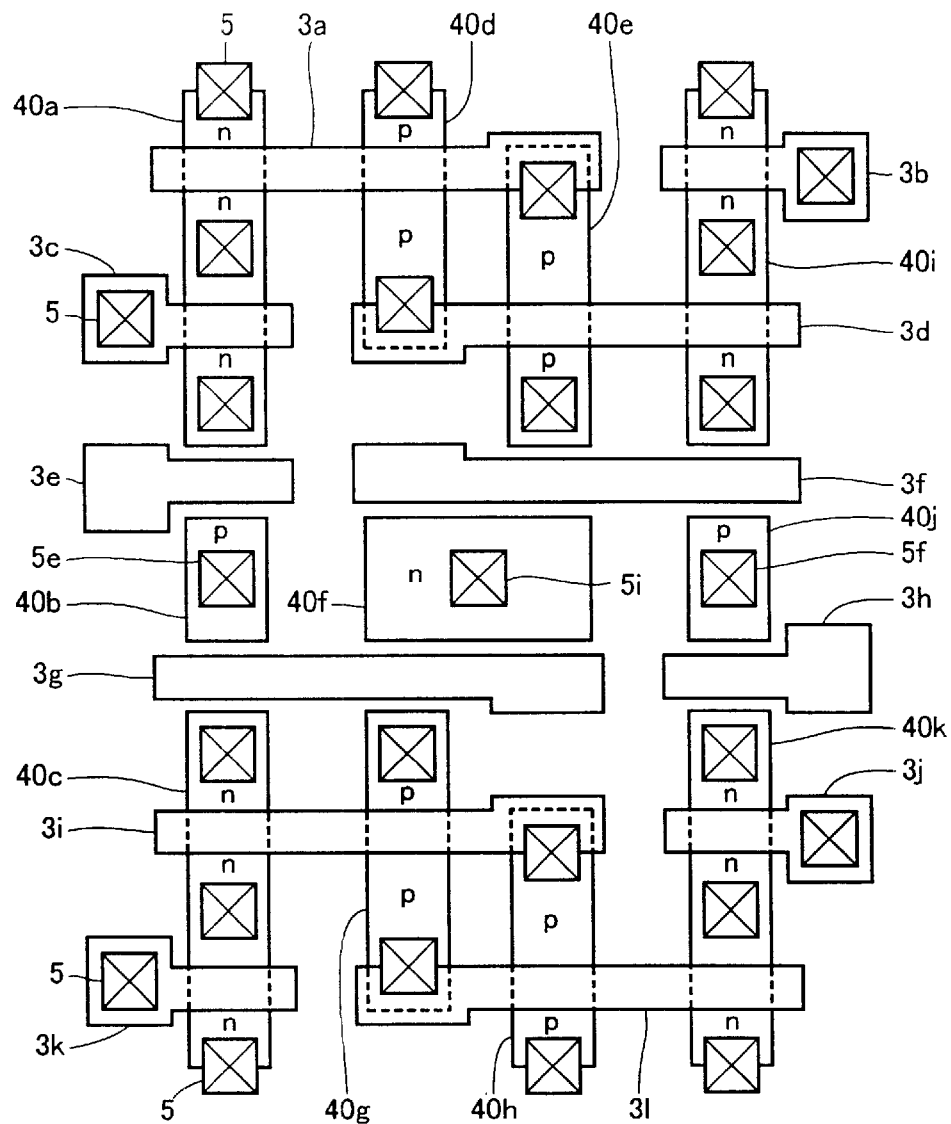
FIG. 14 is a plan view showing a layout of polysilicon layers, diffusion regions and contact parts in the memory cell array of the SRAM according to the prior art.

In the example of FIG. 1 well contact cell 2 is arranged between memory cells 1 and a plurality of memory cells 1 are, respectively, arranged above and below well contact cell 2. In addition, diffusion region 4a, or the like, extends in a contiguous manner from the inside of memory cell 1 to the inside of well contact cell 2 and no isolation regions are provided between diffusion regions within memory cells 1 and diffusion regions within well contact cell 2 as opposed to in the prior art shown in FIG. 13.

Accordingly, in order to secure such isolation regions it is not necessary to make the length L of well contact cell 2 long and length L1 of memory cell 1 and length L of well contact cell 2 can be made equal. Therefore, the area of memory cell 1 and the area of well contact cell 2 become equal.

In addition, by making diffusion regions 4a, 4c, 4d and 4f extend in a contiguous manner from the inside of memory cells 1 to the inside of well contact cell 2, the periodicity of the pattern layout of the diffusion regions 4a, 4c, 4d and 4f that is repeated in memory cells 1 can be secured. Thereby, dispersion of transistor characteristics due to the disturbance of the periodicity of the pattern layout in well contact cell 2 can be controlled.

Since, as described above, diffusion regions 4a, 4c, 4d and 4f extend in a contiguous manner from the inside of memory cells 1 to the inside of well contact cell 2 in the present first embodiment, polysilicon layers 3e, 3f, 3g and 3h and diffusion regions 4a, 4c, 4d, and 4f located beneath these layers form pseudo transistors as shown in FIG. 1.

Though the source and drain of a normal MOS transistor are formed of diffusion regions of the same polarity (conductive type) diffusion regions located so as to correspond to the source and drain are formed of diffusion regions of different polarities in pseudo transistor shown in FIG. 1. Elements in the above manner that have structures seemingly the same as those of transistors but do not function practically as transistors are referred to as pseudo transistors or dummy transistors in the present specification.

In the example shown in FIG. 1, six pseudo transistors $Q_D1$ to $Q_D6$ are formed within well contact cell 2. Each pseudo transistor $Q_D1$ to $Q_D6$ has, respectively, a p type diffusion region and an n type diffusion region on both sides of the polysilicon layer and the conductive type of the diffusion region (region corresponding to the channel region) located between these diffusion regions is the same as the conductive type of each well.

Figure 2:
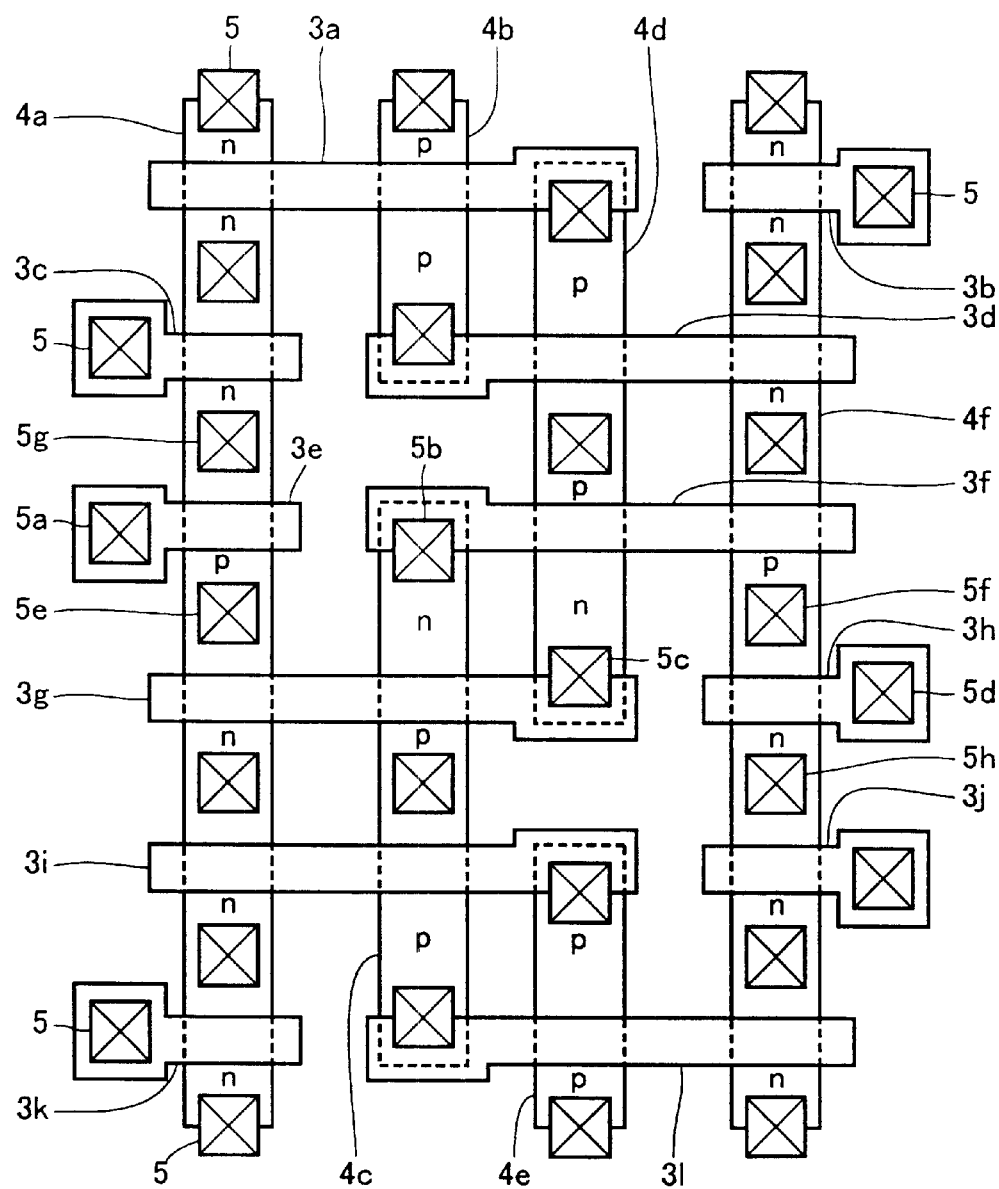
FIG. 2 is a plan view showing a layout of polysilicon layers, diffusion regions and contact parts in the memory cell array of the SRAM according to first embodiment of the present invention.

FIG. 2 shows a layout of contact parts 5, 5a to 5h. As shown in FIG. 2, contact parts 5, 5a to 5h are arranged at predetermined positions of the diffusion regions and in predetermined polysilicon layers so that predetermined diffusion regions and polysilicon layers are electrically connected to the above layer wires via these contact parts.

In the present embodiment contact parts 5a and 5d are, respectively, provided on polysilicon layers 3e and 3h, contact part 5b is provided so as to be a contact part shared by polysilicon layer 3f and diffusion region 4c and contact part 5c is provided so as to be a common contact part shared by polysilicon layer 3g and diffusion region 4d.

Thereby, polysilicon layer 3e, which becomes the gate of pseudo transistor $Q_D1$ and polysilicon layer 3h, which becomes the gate of pseudo transistor $Q_D6$, are fixed at the ground potential via contact parts 5a and 5d while polysilicon layers 3f and 3g, which become the gates of pseudo transistors $Q_D2$ to $Q_D5$, can be fixed at the power supply potential via contact parts 5b and 5c.

Here, p wells are fixed at the ground potential via contact parts 5e, 5f and the p type diffusion regions immediately beneath the contact parts 5e, 5f while the n well is fixed at the power supply potential via contact parts 5b, 5c and n type diffusion region immediately beneath the contact parts 5b, 5c.

Figure 3:
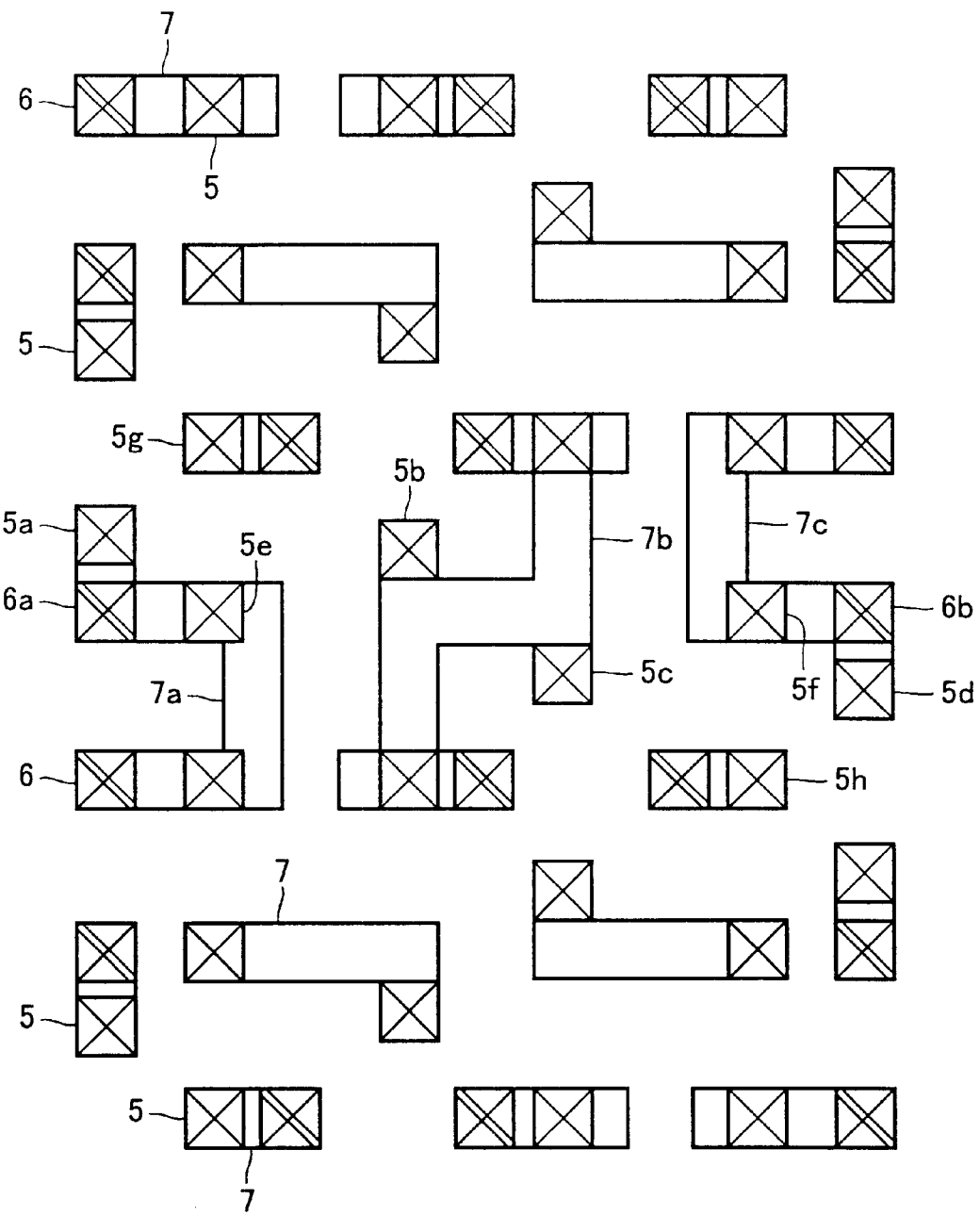
FIG. 3 is a plan view showing a layout of contact parts, first metal wire layers and first via holes in the memory cell array of the SRAM according to first embodiment of the present invention.
Figure 15:
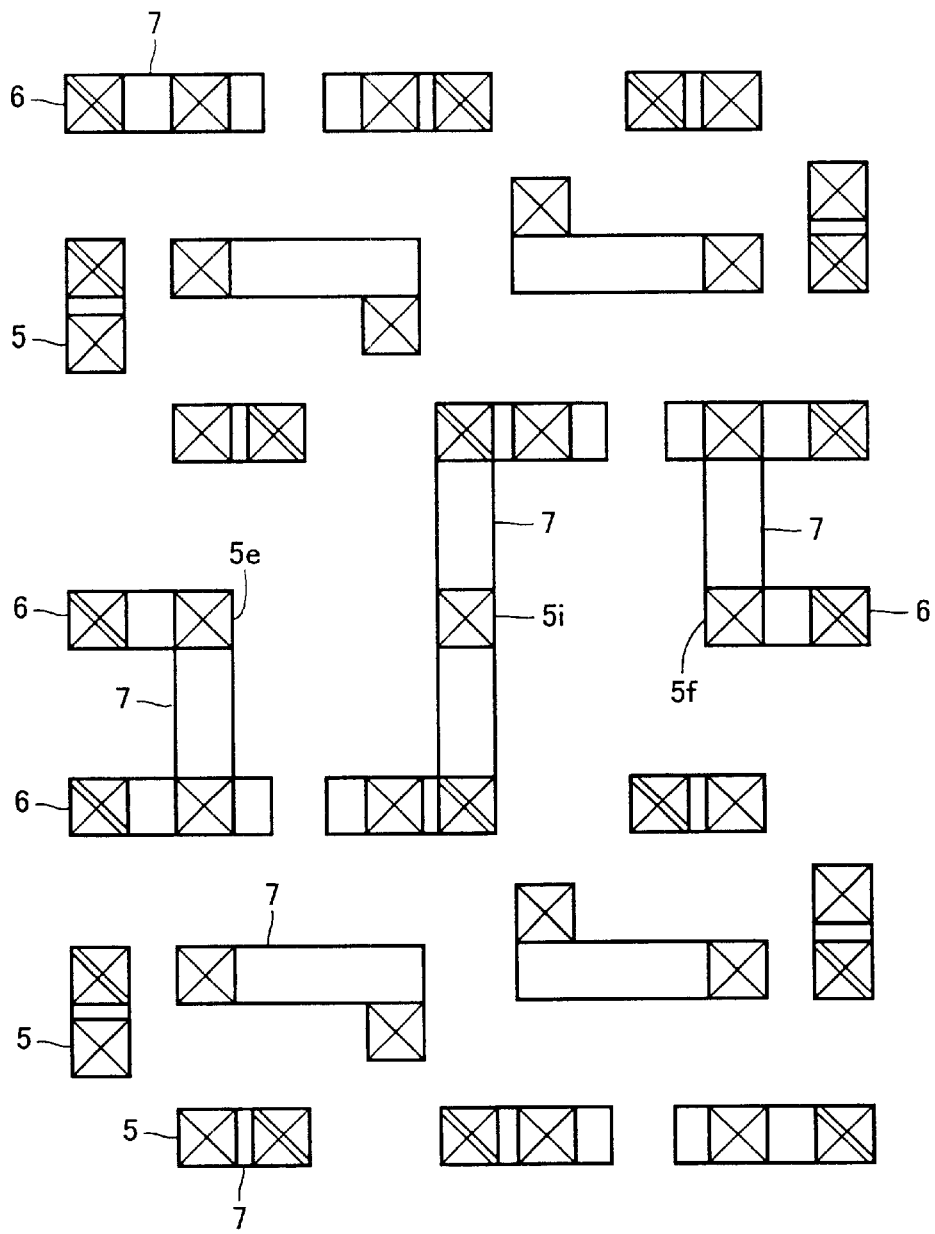
FIG. 15 is a plan view showing a layout of contact parts, first metal wire layers and first via holes in the memory cell array of the SRAM according to the prior art.
Figure 16:
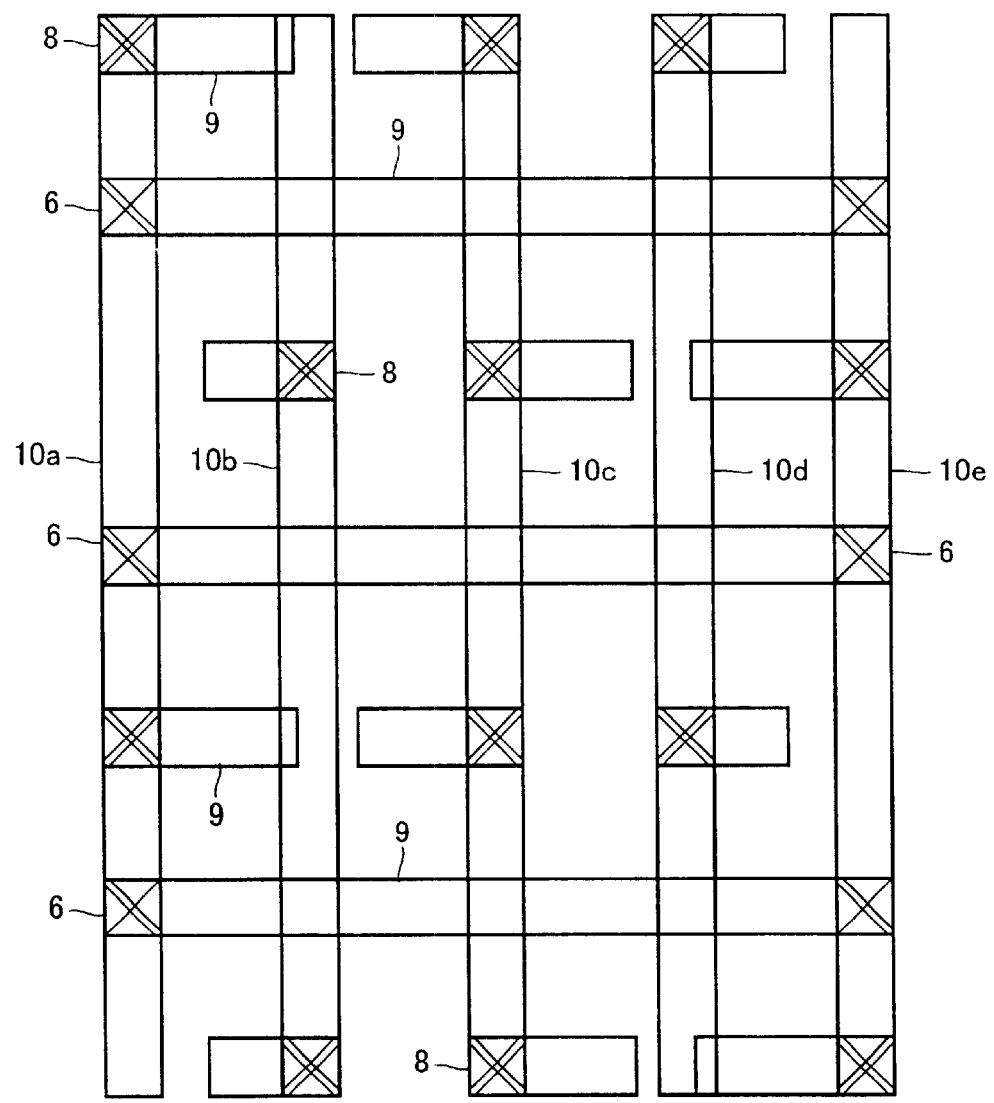
FIG. 16 is a plan view showing a layout of first via holes, second metal wire layers, second via holes and third metal wire layers in the memory cell array of the SRAM according to the prior art.

FIG. 3 shows a layout of first metal wire layers 7, 7a to 7c and first via holes 6, 6a and 6b. First metal wire layers 7, 7a to 7c are formed above polysilicon layers 3a to 3l via an interlayer insulating layer (not shown), or the like. As shown in FIG. 3, predetermined contact parts 5, 5a to 5h and first via holes 6, 6a and 6b are electrically connected by means of first metal wire layers 7, 7a to 7c. The shapes of first metal wire layers 7a to 7c are different from the shape of first metal wire layer 7 shown in the central part of FIG. 15.

Figure 4:
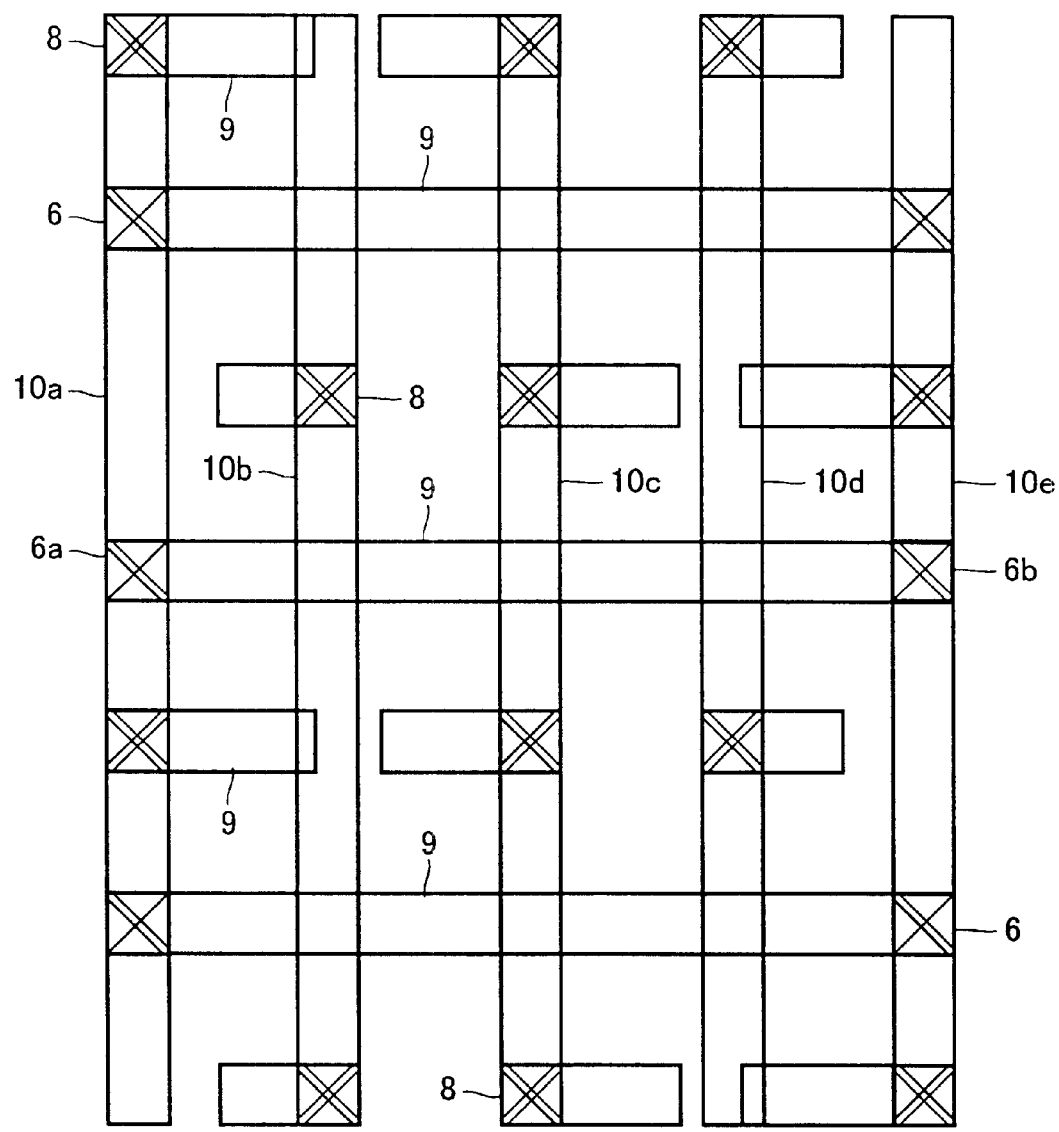
FIG. 4 is a plan view showing a layout of first via holes, second metal wire layers, second via holes and third metal wire layers in the memory cell array of the SRAM according to first embodiment of the present invention.
Figure 5:
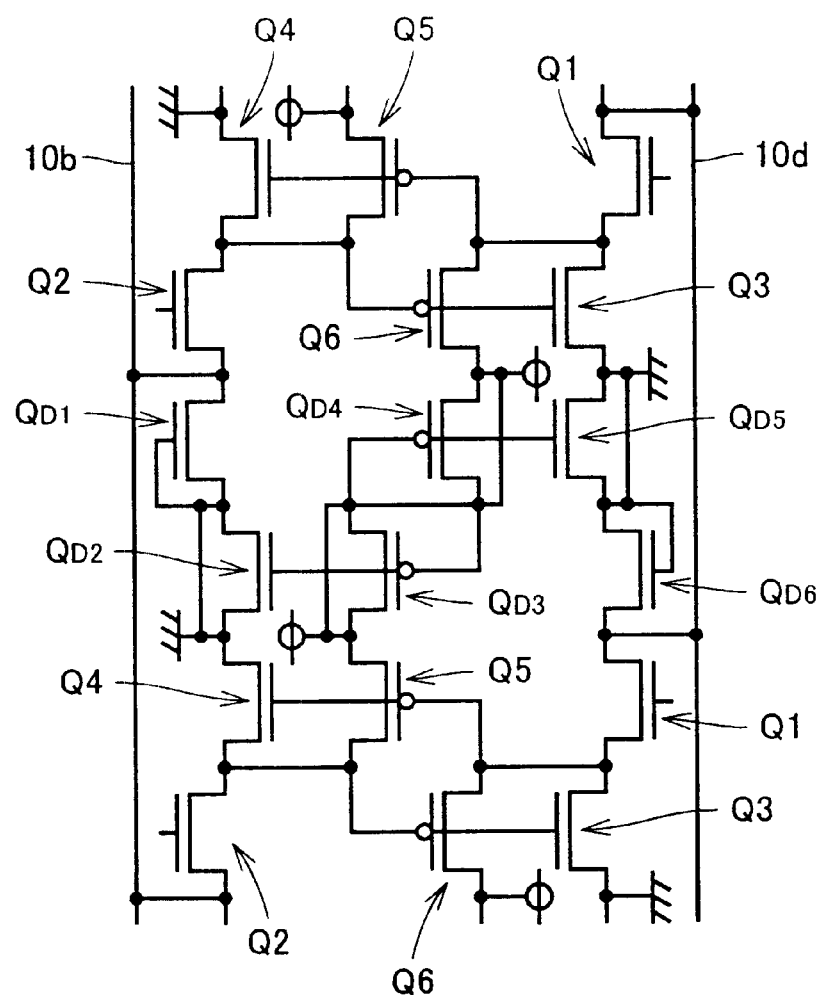
FIG. 5 is a diagram of an equivalent circuit of the memory cell array of the SRAM according to first embodiment of the present invention.

FIG. 4 shows a layout of second metal wire layer 9, third metal wire layers 10a to 10e and second via hole 8. Second metal wire layer 9 is formed above first metal wire layers 7, 7a to 7c via an interlayer insulating layer (not shown), or the like, while third metal wire layers 10a to 10e are formed above second metal wire layer 9 via an interlayer insulating layer (not shown), or the like.

Third metal wire layers 10a and 10e become ground lines (GND lines), third metal wire layer 10b becomes a BIT line, third metal wire layer 10c becomes a power supply line ($V_{DD}$ line) and third metal wire layer 10d becomes a /BIT line.

Third metal wire layer (BIT line) 10b is connected to n type diffusion region 4a immediately beneath contact part 5g via second via hole 8, second metal wire layer 9, first via hole 6, first metal wire layer 7 and contact part 5g (See FIGS. 2 and 3). Third metal wire layer (/BIT line) 10d is connected to n type diffusion region 4f immediately beneath contact part 5h via second via hole 8, second metal wire layer 9, first via hole 6, first metal wire layer 7 and contact part 5h (See FIGS. 2 and 3).

At this time, polysilicon layers 3e and 3h (see FIGS. 1 and 2) adjoining n type diffusion regions 4a and 4f immediately beneath contact parts 5g and 5h in well contact cell 2 are fixed at the ground potential and, thereby, well contact cell 2 can be electrically isolated from the bit lines (BIT line and /BIT line).

As shown in FIG. 4, first metal wire layers 7, 7a to 7c and second metal wire layer 9 are connected via first via holes 6, 6a and 6b while second metal wire layer 9 and third metal wire layers 10a to 10e are connected via second via hole 8.

FIG. 5 is a diagram of an equivalent circuit which shows the arrangement of the respective transistors and the relationships of connections among the wires in memory cells 1 and well contact cell 2 shown in FIGS. 1 to 4.

As shown in FIG. 5, the first inverter in upper and lower memory cells 1 includes driver MOS transistor Q3 and load MOS transistor Q6 while the second inverter includes driver MOS transistor Q4 and load MOS transistor Q5.

The first inverter and the second inverter form a flip-flop wherein the respective inputs and outputs are mutually connected and the first storage node of the flip-flop is connected to the source of access MOS transistor Q1 while the second storage node of the flip-flop is connected to the source of access MOS transistor Q2.

In FIG. 5 pseudo transistors $Q_D1$ to $Q_D6$ formed in well contact cell 2 are represented by the same symbols as the above respective MOS transistors Q1 to Q6. Pseudo transistors $Q_D1$ to $Q_D6$ are arranged in the same manner as of respective MOS transistors Q1 to Q6 within memory cells 1 as shown in FIG. 5.

Thereby, the condition which is equivalent to the existence of respective MOS transistors Q1 to Q6 within memory cells 1 can be implemented within well contact cell 2 and the periodicity of a variety pattern layouts such as of diffusion regions or polysilicon layers can be secured as described above so that the dispersion of the characteristics of the transistors in memory cells 1 can be reduced.

Second Embodiment

Figure 6:
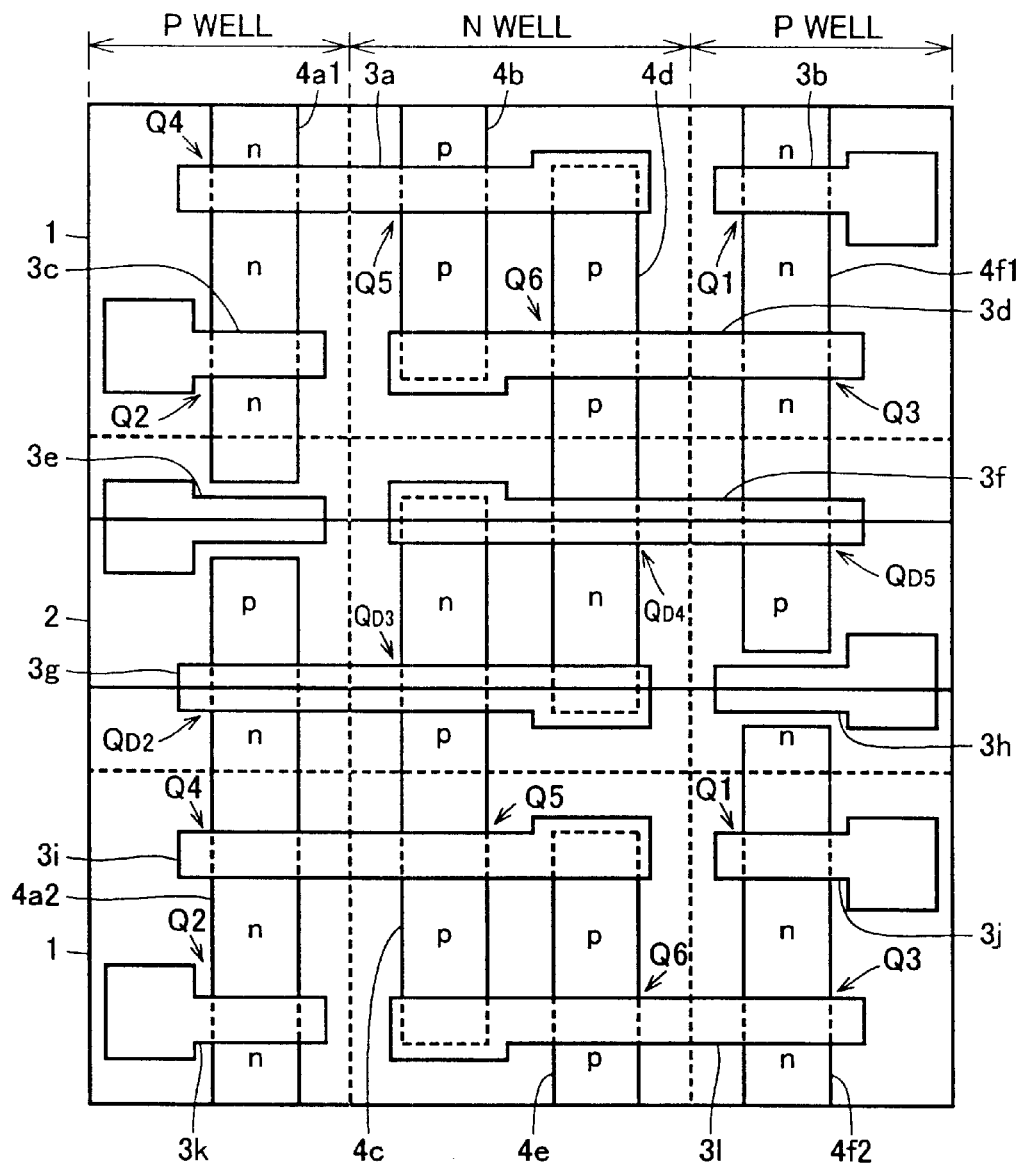
FIG. 6 is a plan view showing a layout of wells, polysilicon layers and diffusion regions in a memory cell array of an SRAM according to second embodiment of the present invention.
Figure 7:
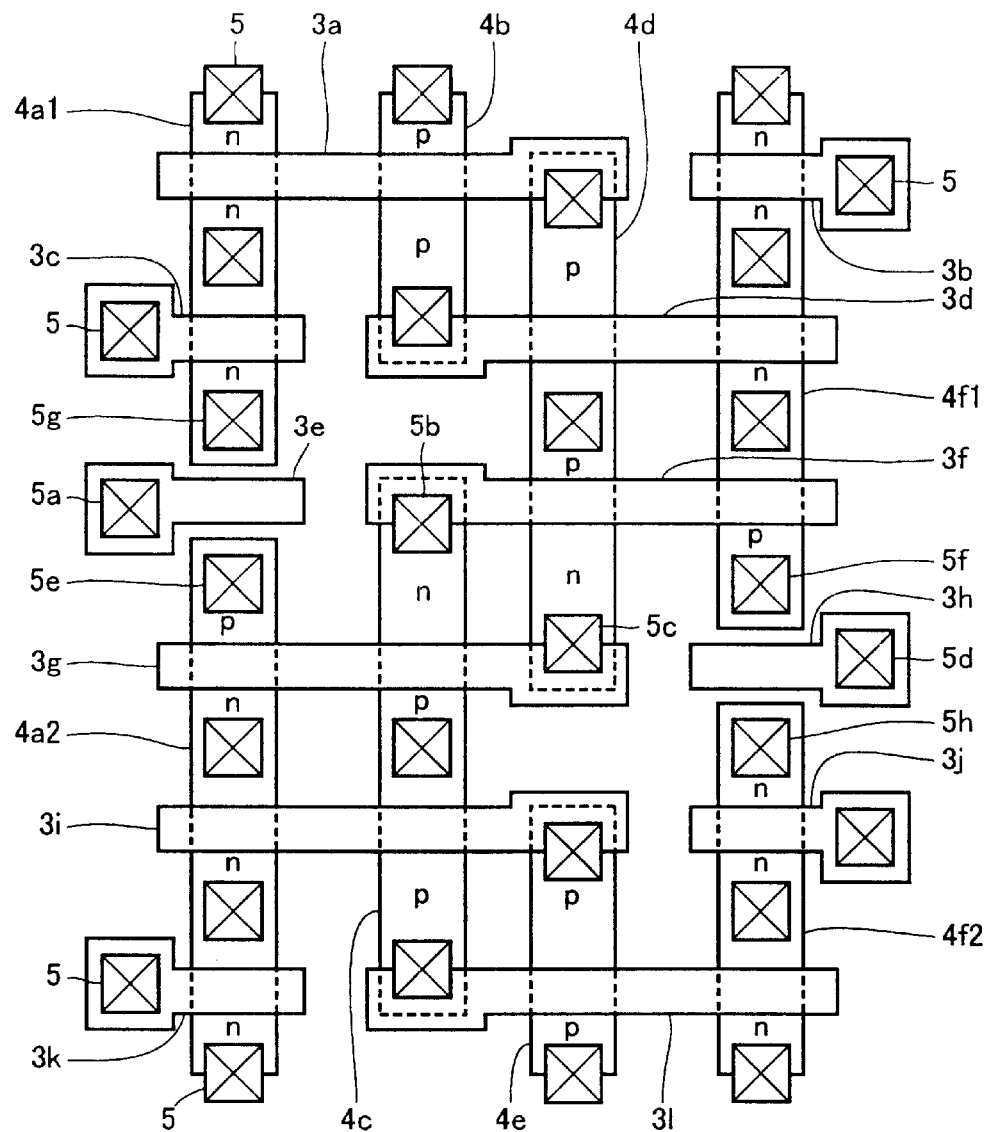
FIG. 7 is a plan view showing a layout of polysilicon layers, diffusion regions and contact parts in the memory cell array of the SRAM according to second embodiment of the present invention.
Figure 8:
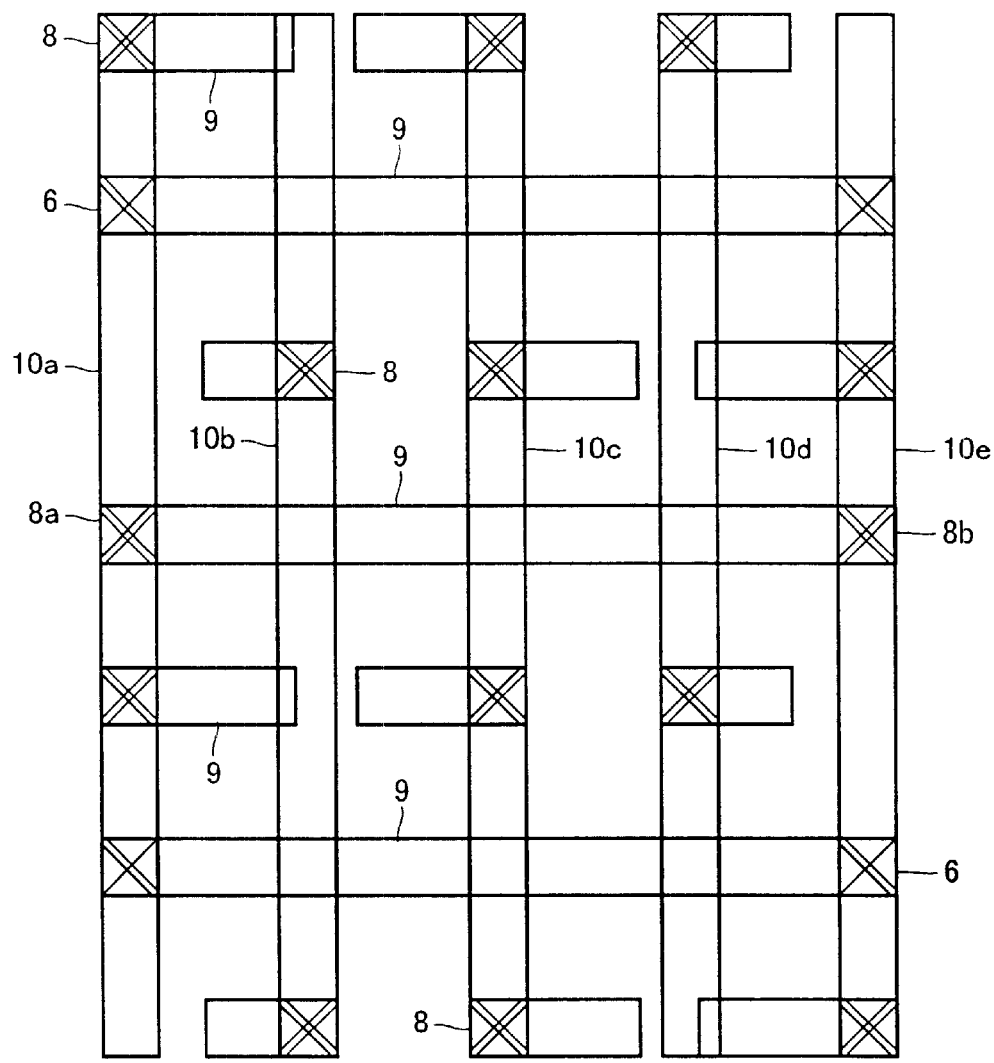
FIG. 8 is a plan view showing a layout of first via holes, second metal wire layers, second via holes and third metal wire layers in the memory cell array of the SRAM according to second embodiment of the present invention.

Next, second embodiment of the present invention is described in reference to FIGS. 6 to 9. FIGS. 6 to 8 are plan views of a memory cell array of an SRAM according to the present second embodiment.

In the present embodiment, as shown in FIGS. 6 and 7, diffusion regions are separated beneath polysilicon layers 3e and 3h so as to form diffusion regions 4a1, 4a2, 4f1 and 4f2. In addition, the layouts of first metal wire layers 7, 7a to 7c and first via holes 6, 6a and 6b are the same as in the case shown in FIG. 3. In addition, as shown in FIG. 8, the layouts for second via holes 8, other than second via holes 8a and 8b, first via hole 6, second metal wire layer 9 and third metal wire layers 10a to 10e are almost the same as in the case of FIG. 4.

By separating the diffusion region beneath polysilicon layers 3e and 3h as described above, well contact cell 2 can be separated without fail from bit lines so that noise from the bit lines can be effectively suppressed.

Here, though in the example shown in FIGS. 6 and 7, diffusion regions 4a1 and 4a2 are provided so that neither of them overlap polysilicon layer 3e, in the case that diffusion regions 4a1 and 4a2 are separated, one of these regions, at least, may overlap polysilicon layer 3e.

That is to say, it is not necessary to secure a comparatively large gap between diffusion regions 4a1 and 4a2 in order to secure the isolation there between as opposed to as in the prior art. The same conditions apply to diffusion regions 4f1 and 4f2. Accordingly, the layouts of the polysilicon layers and diffusion regions can be essentially the same as in first embodiment so that the periodicity of the pattern layout can be improved in comparison with the prior art.

Figure 9:
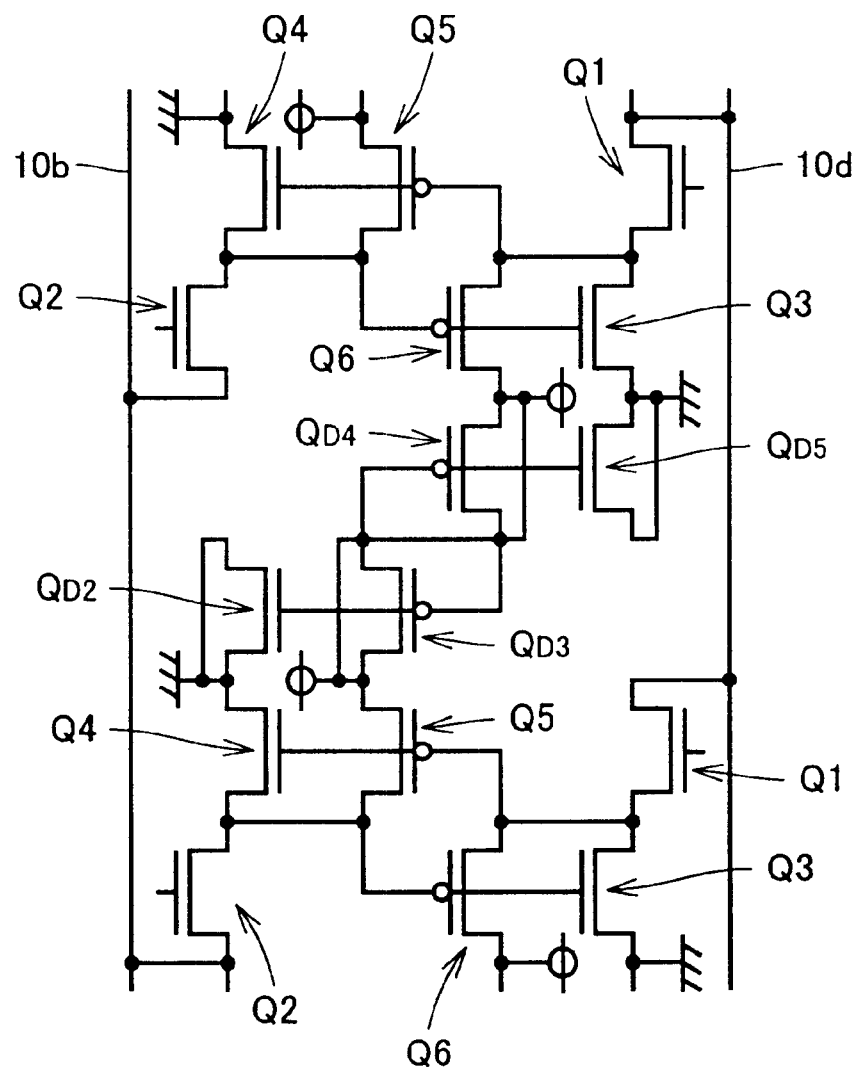
FIG. 9 is a diagram of an equivalent circuit of the memory cell array of the SRAM according to second embodiment of the present invention.

FIG. 9 shows a diagram of an equivalent circuit of the memory cell array of the SRAM according to the present embodiment.

Since diffusion regions 4a1 and 4a2 as well as diffusion regions 4f1 and 4f2 are isolated as described above, pseudo transistors $Q_D1$ and $Q_D6$ are not formed as shown in FIG. 9 and well contact cell 2 can be electrically isolated from third metal wires 10b and 10d (bit lines). The configuration other than the above components is the same as in the case shown in FIG. 5.

Here, the layouts of the diffusion regions and second via holes are not limited to those in embodiments 1 and 2. That is to say, FIGS. 1, 2, 3 and 8 or FIGS. 3, 4, 6 and 7 may be combined.

Third Embodiment

Figure 10:
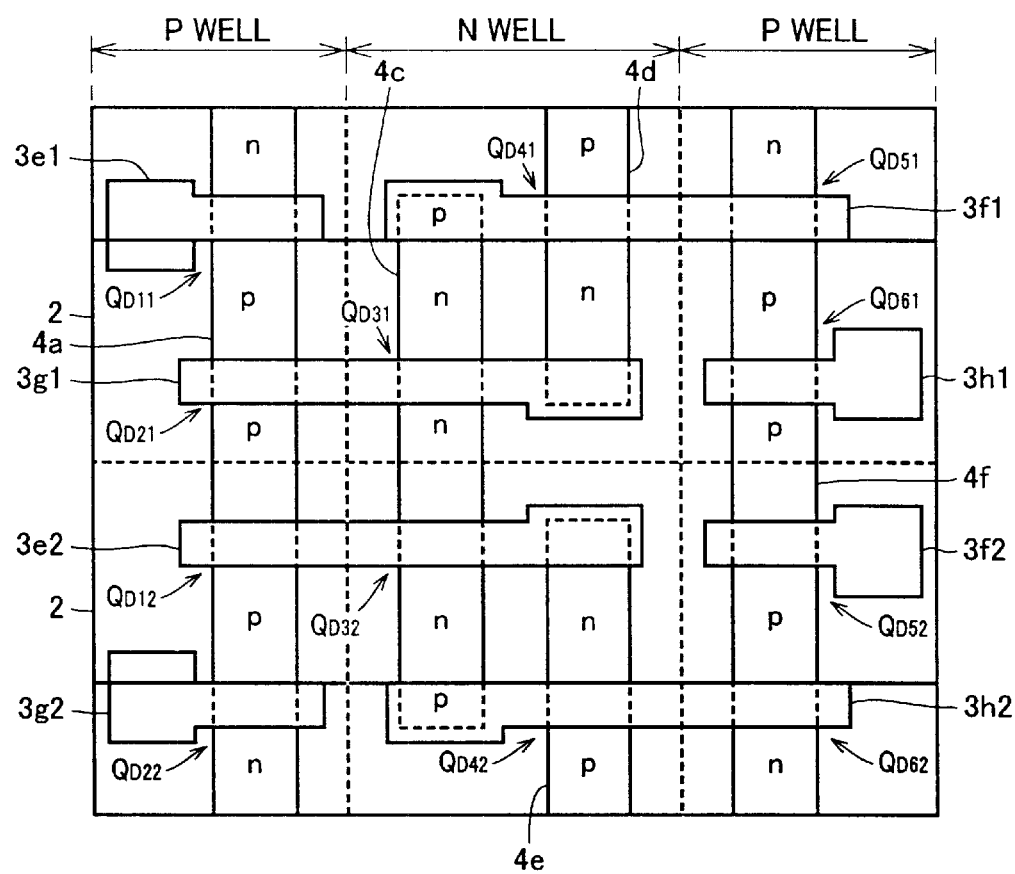
FIG. 10 is a plan view showing a layout of wells, polysilicon layers and diffusion regions in a memory cell array of an SRAM according to third embodiment of the present invention.
Figure 11:
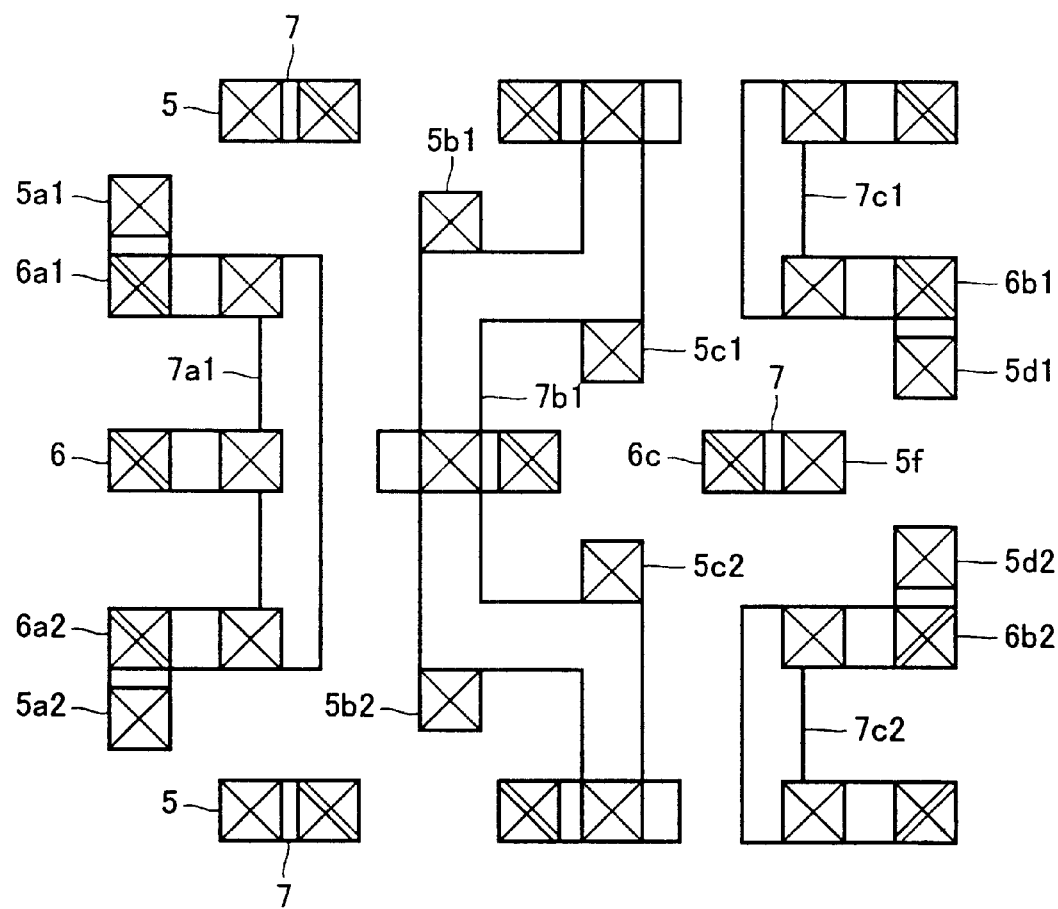
FIG. 11 is a plan view showing a layout of contact parts, first metal wire layers and first via holes in the memory cell array of the SRAM according to third embodiment of the present invention.
Figure 12:
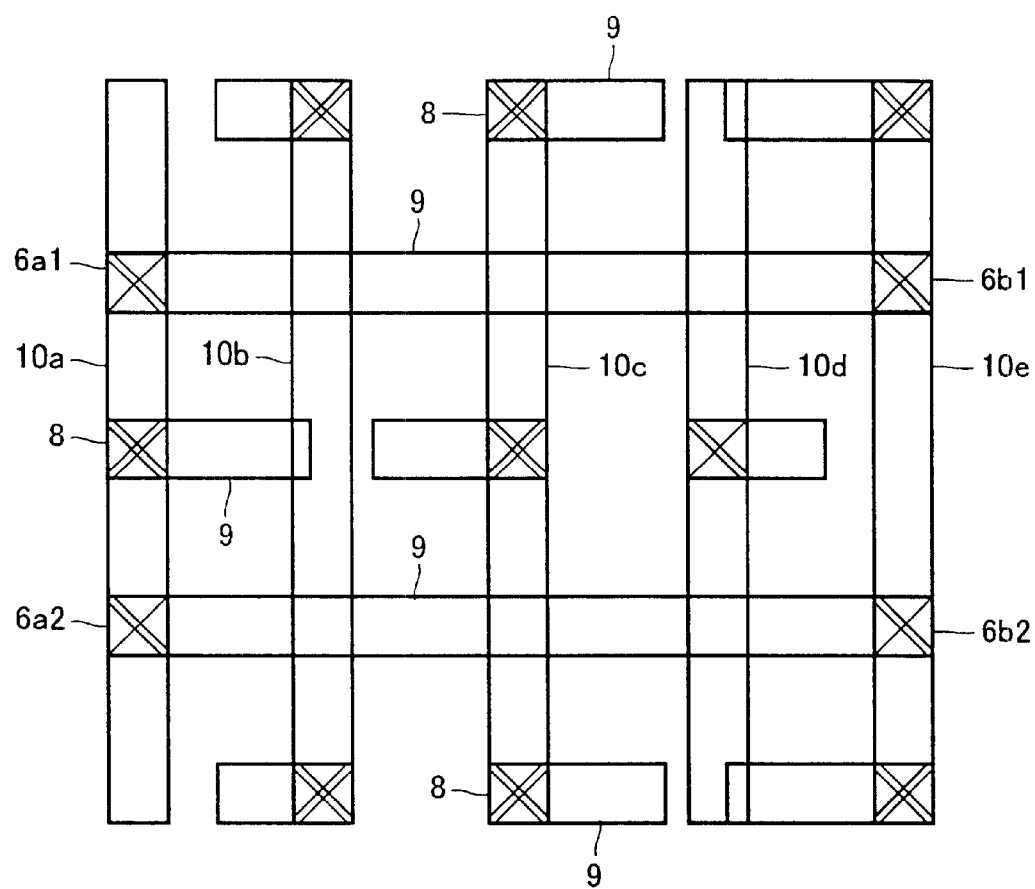
FIG. 12 is a plan view showing a layout of first via holes, second metal wire layers, second via holes and third metal wire layers in the memory cell array of the SRAM according to third embodiment of the present invention.

Next, third embodiment of the present invention is described. FIGS. 10 to 12 are plan views of a memory cell array of an SRAM according to the present third embodiment.

In the present third embodiment a plurality of well contact cells 2 are arranged so as to adjoin each other. Though two well contact cells 2 are shown in the example shown in FIG. 10, the number of well contact cells 2 are arbitrarily selectable. A plurality of memory cells are, respectively, arranged above and below this pair of well contact cells 2. The pattern layout including the memory cells and well contact cells 2 is the same as in each of the above described embodiments.

As shown in FIG. 10, diffusion regions 4a and 4f extend so as to traverse both well contact cells 2 in the upper and lower directions and reach, respectively, to the insides of the upper and lower memory cells. Diffusion region 4c extends from the inside of upper well contact cell 2 to the inside of lower well contact cell 2. Diffusion regions 4d and 4e extend from the insides of the upper and lower memory cells to the insides of well contact cells 2.

By making the forms of diffusion regions within well contact cells 2 the same as the forms as described above, the periodicity of the diffusion region pattern within well contact cells 2 can be secured even in the case wherein a plurality of well contact cells 2 are arranged side by side. In addition, by arranging polysilicon layers 3e1 to 3h1 and 3e2 to 3h2 within well contact cells 2 in the same manner as within the memory cells, the periodicity of the polysilicon layer pattern can be secured.

Accordingly, in the same manner as in the case of each of the above described embodiments, the periodicity of the pattern such as of diffusion regions or polysilicon layers can be secured within a plurality of well contact cells 2 so that the dispersion of the characteristics of the transistors in the memory cells can be made small.

In addition, by arranging a plurality of well contact cells 2 side by side, the area of the injection region for the well contact can be made larger. Thereby, impurity injection into well contact cells 2 can be easily carried out so that the memory cell array manufacturing process becomes easy.

In the present embodiment, as shown in FIG. 10, pseudo transistors $Q_D11$ to $Q_D61$ are formed within upper well contact cells 2 while pseudo transistors $Q_D12$ to $Q_D62$ are formed within lower well contact cells 2.

As shown in FIG. 11, contact parts 5, 5a1 to 5d1 and 5a2 to 5d2 are formed and first metal wire layers 7, 7a1 to 7c1 and 7c2 are formed so as to connect predetermined contact parts to each other from among the above and, then, first via holes 6, 6a1, 6a2, 6b1, 6b2 and 6c are formed.

As shown in FIG. 12, second via hole 8 is formed above a predetermined first via hole and second metal wire layer 9 is formed above first metal wire layers 7, 7a1 to 7c1 and 7c2 via an interlayer insulating layer and, then, third metal wire layers 10a to 10e are formed above second metal wire layer 9 via an interlayer insulating layer.

Here, since second via hole 8 is not formed above first via hole 6c, third metal wire layer (bit line) 10d is not connected to p type diffusion region 4f which is located directly beneath contact part 5f and is maintained at the ground potential. Accordingly, the bit line can be prevented from being grounded so that negative effects to the bit line can be avoided.

Though embodiments of the present invention are described in the above, the characteristics of the respective embodiments are assumed to be combined in an appropriate manner from the start.

According to the present invention, the pattern of, for example, diffusion regions or polysilicon layers (gates) which is the same as that within memory cells can be formed within well contact cells and, therefore, the periodicity of the above pattern layout can be prevented from being disturbed in well contact cells. Thereby, dispersion of the size of each pattern after the formation due to the disturbance of the periodicity of the pattern layout of the above pattern can be prevented from occurring so that the dispersion of the characteristics of the transistors formed within the memory cells can be made small.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static-type semiconductor memory device comprising:

a plurality of memory cells provided over a plurality of wells for storing data which do not have a well contact region for fixing the potential of said wells; and a plurality of well contact cells provided over said plurality of wells so as to adjoin said memory cells for fixing the potential of said wells, wherein the areas of said memory cells and the areas of said well contact cells are equal.

2. The static-type semiconductor memory device according to claim 1, wherein said memory cells have first diffusion regions of a first conductive type and said well contact cells have second diffusion regions of a second conductive type for fixing the potential of said wells, and said first and second diffusion regions are connected within said well contact cells via third diffusion regions.

3. The static-type semiconductor memory device according to claim 2, wherein said well contact cells have first conductive layers which extend above said third diffusion regions, and said first conductive layers are fixed at the ground potential.

4. The static-type semiconductor memory device according to claim 2, wherein bit lines are provided, and said first diffusion regions are connected to said bit lines.

5. The static-type semiconductor memory device according to claim 2, wherein said plurality of wells include first wells of the first conductive type and second wells of the second conductive type, said first, second and third diffusion regions are located in said second wells, said well contact cells are located in said first wells and have fourth diffusion regions of the first conductive type for fixing the potential of said first wells, said memory cells have fifth diffusion regions of the second conductive type located in said first wells, said fourth diffusion regions and said fifth diffusion regions are connected within said well contact cells via sixth diffusion regions, second conductive layers are formed above said sixth diffusion regions, and said fourth diffusion regions, said fifth diffusion regions and said second conductive layers are fixed at the power supply potential.

6. The static-type semiconductor memory device according to claim 1, wherein said plurality of wells include first wells of a first conductive type and second wells of a second conductive type, said memory cells have first diffusion regions of the first conductive type and third diffusion regions of the second conductive type, said well contact cells have second diffusion regions of the second conductive type for fixing the potential of said second wells and fourth diffusion regions of the first conductive type for fixing the potential of said first wells, said first and second diffusion regions are located in said second wells, said third and fourth diffusion regions are located in said first wells, and said first and second diffusion regions are isolated from each other within said well contact cells while said third and fourth diffusion regions are connected within said well contact cells via fifth diffusion regions.

7. The static-type semiconductor memory device according to claim 6, wherein first conductive layers are formed on regions between said first and second diffusion regions, second conductive layers are formed on said fifth diffusion regions, and said second conductive layers, said third diffusion regions and said fourth diffusion regions are fixed at the power supply potential.

8. The static-type semiconductor memory device according to claim 6, wherein bit lines are provided, and said first diffusion regions are connected to said bit lines.

9. The static-type semiconductor memory device according to claim 1, wherein said memory cells are arranged on both sides of said well contact cells.

10. The static-type semiconductor memory device according to claim 1, wherein said plurality of well contact cells are arranged so as to adjoin each other.

11. The static-type semiconductor memory device according to claim 10, wherein said plurality of well contact cells include first and second well contact cells, said first well contact cells have said second diffusion regions and seventh diffusion regions of a second conductive type connected to the second diffusion regions, and said second well contact cells have eighth diffusion regions of the second conductive type that are connected to said seventh diffusion regions and that extend within said first well contact cells.

12. The static-type semiconductor memory device according to claim 1, wherein said memory cells and said well contact cells are aligned in the direction perpendicular to the direction along which said plurality of wells are aligned.

* * * * *